United States Patent Office 3,458,312

Patented July 29, 1969

3,458,312

SOLVENT STRIPPABLE PHOTOSENSITIVE COMPOSITIONS AND METHOD OF PRODUCTION THEREFOR

Rangaswamy Srinivasan, Briarcliff Manor, N.Y., assignor to International Business Machines Corporation, Armonk, N.Y., a corporation of New York No Drawing. Filed Sept. 19, 1966, Ser. No. 580,186
Int. Cl. G03c 1/68; G03f 7/10
U.S. Cl. 96—36 16 Claims This invention relates generally to photoresist formulations and more particularly relates to photoresist formulations of low molecular weight which are non-tacky and are solvent strippable.

Photoresists are materials which under the action of radiant energy change their characteristics, by cross-linking, so that they become insoluble in certain solvents and hence can be used to protect selected areas of a substrate from the action of an etchant. With the advent of integrated circuit technology, the use of photoresists to provide precise masking for etching processes and the like has assumed an increasingly important part in the manufacture of integrated circuit devices. The requirements of the usual manufacturing process dictate many of the properties which should be present in a photoresist if if is to be workable. Thus, properties such as adhesion to the material which is to be etched and fast exposure time of the resist are desirable if not required properties in present day manufacturing techniques. In many instances, to obtain a property such as fast exposure time photoresists containing high molecular weight polymers are utilized which result in developed materials which are most difficult to remove or strip from the surface of the material which has been protected from the action of an etchant. Most known manufacturing techniques remove the resist after an etching step by mechanical abrasion or by a combination of mechanical abrasion and chemical solvents. Stripping by these techniques can be rather critical since care must be taken not to damage the surface of the underlying material. Many chemical solvents often react with the underlying material, thereby severely limiting the stripping agents which can be utilized. Expedients such as starting with low molecular weight polymers have not been fruitful in the past because the material remained tacky, was amenable to handling and exposure times to polymerize the resist were increased. From the foregoing, it may be seen that the problems associated with photoresist stripping are not simple and are assuming greater proportions particularly where production schedules and high yields must be maintained.

It is, therefore, an object of this invention to provide photoresist compositions which are solvent strippable.

Another object is to provide photoresist compositions of low molecular weight which are non-tacky and have good adhesive quality.

Another object is to provide photoresists which are solvent strippable without sacrificing exposure speed and spectral response.

Another object is to provide solvent strippable photoresists which where suitably processed, are resistant to both acid and alkaline etchants.

Another object is to provide solvent strippable photoresists which are relatively inexpensive and comparable in performance to presently available photoresists.

Still another object is to provide a method of producing a non-tacky, adherent, inert, to etchants solvent strippable photoresist.

In accordance with the present invention, a condensation product from a cyclic ketone is mixed with a photosensitive perchlorinated compound. The compound is capable of initiating free radical reactions as well as Diels-Alder addition and possibly reacts by both of theses avenues. More specifically, a starting material is provided which is capable of condensing to form a product with polar groups and unsaturation. The polar groups are desirable in that the resulting product is non-tacky at low molecular weight. Cyclic ketones such as cyclohexanone, cycloheptanone and cyclooctanone form resins as a result of the self-condensation of these ketones in the presence of light with carbon tetrachloride or hydrogen chloride in the dark as a condensation catalyst. The resulting condensation product has the desired polar groups which are identifiable as carbonyl groups with unsaturation. The cyclic ketones have relatively low molecular weights, cyclohexanone, for example, having a molecular weight of 98. The resulting condensation products of the cyclic ketones used have molecular weights in the 300–400 range.

Cross-linking agents such as:
Perchlorofulvalene
Hexachloro-1,3 butadiene
Hexachloro-1,3-cyclopentadiene
Hexachloro 2-cyclopentenone
Chlorendic anhydride
Hexachloro [2.2.1] bicycloheptadiene
Hexachloro cyclohexa 2,4-diene-one
Hexachloro cyclohexa 2,5-dieneone
Chloranil
1,2,3,4,5,6 hexachlorobenzene, which are commercially available are useful in the practice of this invention.

One of the condensation products with a number of residual carbonyl group with unsaturation is obtained from a cyclic ketone by mixing cyclohexanone, for example, with a suitable amount of carbon tetrachloride. The sample is exposed to a desired level of actinic light for a suitable time. After exposure, the unreacted cyclohexanone is distilled off at one atmosphere pressure. The residue is then distilled at reduced pressure to give a compound which has the approximate composition $C_{18}H_{26}O$.

The resulting product and one of the cross-linking agents set out above are then mixed in suitable amounts in a solvent to provide the non-tacky, low molecular weight, photoresist compositions of the present invention. The resulting photoresist composition is then coated on the surface of a substrate and dried at room temperature. Upon exposure to actinic light through a mask, the unmasked or light struck areas are polymerized and an insoluble image is formed in the photoresist. The areas which are masked have not been changed so they remain soluble in benzene and are removed or developed by washing in benzene or other non-polar solvent.

Upon drying to remove the solvent and other volatile products, the masked substrate is subjected to the action of an etchant. The polymerized or insoluble image resists the action of both acid and 20% alkaline solutions. After etching of the substrate, the resist is removed or stripped by washing in acetone or other polar solvent without further action being required.

The foregoing and other features and objects of the present invention will be apparent from the following more particular description of preferred embodiments of the invention.

To obtain a photoresist in accordance with the present invention a condensation product with a number of residual carbonyl groups with unsaturation must first be provided by the self-condensation of a cyclic ketone selected from the group consisting of cyclohexanone, cycloheptanone and cyclooctanone. The synthesis of the condensation product is relatively simple. Fifty grams of the selected cyclic ketone, cyclohexanone, for example, is mixed with 1 gram of a condensation catalyst such as carbon tetrachloride and exposed to a 1000 watt ultraviolet lamp for two hours or treated with hydrogen chloride alone in the dark for the same time. The unreacted cyclohexanone is distilled off at 1 atmosphere pressure. The residue is then distilled at reduced pressure to give a compound which had the approximate composition $C_{18}H_{26}O$. The yield is 8 grams. Similarly, depending on the starting cyclic ketone the resulting product may be a trimer or a tetramer of the cyclic ketone and may vary in molecular weight from 300 to 400.

After the product is synthesized, any one of the resulting products and any one of the cross-linking agents mentioned hereinabove may be blended in a suitable chlorinated solvent, such as chlorobenzene or carbon tetrachloride. Once the materials are blended, no further synthesis required and the photoresist composition is ready for immediate use. The photoresist compositions of the present invention have a wide spectral response ranging from 4000 A. to 2000 A. The exposure times or speed of response, of course, varies with the relative amounts of the constituents as well as the light source and may be varied over a relatively wide range. The compositions of the present invention in addition to acting as etch resistant masks in the formation of integrated circuit devices can also be utilized in the graphic arts in the conventional way. The resists described herein can be used on such metals as copper, aluminum and chromium.

In general, to obtain the preferred compositions of the present invention, the desired condensation product of a cyclic ketone in solution in a chlorinated solvent is mixed with a perchlorinated compound of unsaturated nature. In cases where the later are liquids they are used as such. In other cases, where the latter are solids, a saturated solution in a chlorinated solvent is used. The polymerized material resulting from exposure to actinic light, after an etching step, is solvent strippable using a polar solvent such as methyl ethyl ketone or acetone. The following examples will indicate the proportions of the various constituents, but it should be appreciated that any one of the condensation polymers can be reacted with any one of the perchlorinated compounds to provide a useful photoresist.

Example I.—Condensation product of cyclohexanone

A sample of 50 grams of cyclohexanone and 1 gram of carbon tetrachloride is exposed to a 1000 watt ultraviolet lamp for 2 hours. The unreacted cyclohexanone is then distilled off by heating at 1 atmosphere pressure. The residue is distilled at reduced pressure to provide a compound having the approximate composition $C_{18}H_{26}O$. The yield is 8 grams.

Example II.—Condensation product of cyclopentanone

The steps taken are exactly the same as described in connection with Example I with the exception that cyclopentanone instead of cyclohexanone is used. The resulting compound has an approximate composition of $C_{15}H_{20}O$.

Example III.—Condensation product of cyclooctanone

The steps taken are exactly the same as described in connection with Example I with the exception that cyclooctanone instead of cyclohexanone is used. The resulting compound has an approximate composition of $C_{24}H_{38}O$.

Example IV.—Cyclohexanone condensation product and perchlorofulvalene

A 5% solution of the cyclohexanone condensation product in carbon tetrachloride is mixed with an equal volume of a saturated solution of perchlorofulvalene in carbon tetrachloride. The mixture is coated on a suitable substrate and dried at room temperature to remove the solvent and other volatile materials. The resulting resist is then exposed to ultraviolet light from a medium pressure arc lamp for five minutes through a mask. The unexposed areas of the resist are then removed or developed by washing in benzene or in other non-polar solvents such as petroleum ether or cyclohexane. After exposing the exposed surface of the underlying substrate to the action of an etchant, the masking portion of the resist is removed or stripped from the surface of the substrate by washing in methylethyl ketone or acetone or other polar solvent. It should be appreciated that any suitable substrate such as a metal, semiconductor, glass, cloth, paper or synthetic resin may be used as a substrate.

Example V.—Cycloheptanone condensation product and hexachloro 1,3-cyclopentadiene The solvent strippable photoresist of this example is obtained in the same way as described in connection with Example IV except that the condensation product results from the self-condensation of cycloheptanone and the cross-linking agent is hexachloro 1,3-cyclopentadiene.

Example VI.—Cyclooctanone condensation product and hexachloro 1,3-butadiene

The solvent strippable photoresist of this example is obtained in the same way as described in connection with Example IV except that the condensation product results from the self-condensation of cyclooctanone and the cross-linking agent is hexachloro 1,3-butadiene.

Example VII.—Cyclohexanone condensation product and hexachloro 2-cyclopentenone

The solvent strippable photoresist of this example is obtained in the same way as described in connection with Example IV except that the cross-linking agent is hexachloro 2-cyclopentenone.

Example VIII.—Cyclohexanone condensation product and chlorendic anhydride

The solvent strippable photoresist of this example is obtained in the same way as described in connection with Example IV except that the cross-linking agent is chlorendic anhydride.

While the invention has been particularly shown and described with reference to preferred embodiments thereof, it will be understood by those skilled in the art that changes in form and details may be made therein without departing from the spirit and scope of this invention.

What is claimed is:

1. A solvent strippable photoresist composition comprising a condensation product from a cyclic ketone having molecular weights in the range 300–400 and a perchlorinated compound of unsaturated nature incorporated in said condensation product as a cross-linking agent.

2. A solvent strippable photoresist composition according to claim 1 wherein said cyclic ketones include cyclic ketones selected from the group consisting of cyclohexanone, cycloheptanone and cyclooctanone.

3. A solvent strippable photoresist composition according to claim 1 wherein said perchlorinated compound of unsaturated nature includes compounds selected from the group consisting of perchlorofulvalene, hexachloro 1,3-cyclopentadiene, hexachloro 1,3-butadiene, hexachloro 2-cyclopentenone, chlorendic anhydride, hexachloro [2.2.1]bicycloheptadiene, hexachloro cyclohexa 2,4-diene-one, hexachloro cyclohexa 2,5-dieneone, chloranil and 1,2,3,4,5,6-hexachlorobenzene.

4. A solvent strippable photoresist comprising a condensation product of a cyclic ketone with at least one residual carbonyl group with unsaturation resulting from the condensation of a cyclic ketone with a condensation catalyst in the presence of light and a perchlorinated compound of unsaturated nature incorporated in said condensation polymer as a cross-linking agent.

5. A solvent strippable photoresist according to claim 4 wherein said cyclic ketones include cyclic ketones selected from the group consisting of cyclohexanone, cycloheptanone and cyclooctanone.

6. A solvent strippable photoresist according to claim 4 wherein said perchlorinated compounds of unsaturated nature includes compounds selected from the group consisting of perchlorofulvalene, hexachloro 1,3-cyclopentadiene, hexachloro 1,3-butadiene, hexachloro 2-cyclopentenone, chlorendic anhydride, hexachloro [2.2.1]bicycloheptadiene, hexachloro cyclohexa 2,4-diene-one, hexachloro cyclohexa 2,5 dieneone, chloranil and 1,2,3, 4,5,6 hexachlorobenzene.

7. A solvent strippable photoresist composition comprising a condensation product with at least one polar group and unsaturation of a cyclic ketone selected from the group of cyclic ketones consisting of cyclohexanone, cycloheptanone and cyclooctanone and a perchlorinated compound of unsaturated nature incorporated in said condensation polymer as a cross-linking agent.

8. A solvent strippable photoresist composition according to claim 7 further including a chlorinated solvent.

9. A solvent strippable photoresist composition according to claim 8 wherein said chlorinated solvent is selected from the group consisting of chlorobenzene and carbon tetrachloride.

10. A method of producing a non-tacky, adherent, inert, solvent strippable photoresist upon a substrate material comprising the steps of:

coating said substrate with a film of a composition consisting of a condensation product of a cyclic ketone having a molecular weight in the range of 300–400 and a perchlorinated compound of unsaturated nature as a cross-linking agent in a solvent, drying said film at a temperature sufficient to remove said solvent, exposing said film to ultraviolet light through a mask for a time sufficient to polymerize the light struck areas of said film, developing said film in a non-polar solvent to remove areas other than said light struck areas to expose a portion of the surface of said substrate to the action of an etchant and, stripping said light struck areas from said substrate by washing with a polar solvent.

11. A method according to claim 10 wherein said cyclic ketone includes a cyclic ketone selected from the group consisting of cyclohexanone, cycloheptanone and cyclooctanone.

12. A method according to claim 10 wherein said perchlorinated compounds of unsaturated nature includes compounds selected from the group consisting of perchlorofulvalene, hexachloro 1,3-cyclopentadiene, hexachloro 1,3-butadiene, hexachloro 2-cyclopentenone, chlorendic anhydride, hexachloro [2.2.1] bicycloheptadiene, hexachloro cyclohexa 2,4-diene-one, hexachloro cyclohexa 2,5 dieneone, chloranil and 1,2,3,4,5,6 hexachlorobenzene.

13. A method according to claim 10 wherein said solvent includes chlorinated solvents.

14. A method according to claim 10 wherein said non-polar solvent is selected from the group consisting of petroleum ether and cyclohexene.

15. A method according to claim 10 wherein said polar solvent is selected from the group consisting of methyethyl ketone and acetone.

16. A method according to claim 10 wherein said substrate material includes material selected from the group consisting of metals, semiconductors, glass, paper, cloth, and synthetic resins.

References Cited

UNITED STATES PATENTS

| | | | |
|---|---|---|---|
| 3,024,180 | 3/1962 | McGraw | 96—115 X |
| 3,091,532 | 5/1963 | Michaelson | 96—115 X |
| 3,201,240 | 8/1965 | Faber | 96—115 X |
| 3,347,676 | 11/1967 | Cripps | 96—115 |

NORMAN G. TORCHIN, Primary Examiner

R. E. MARTIN, Assistant Examiner

U.S. Cl. X.R.

96—36.2, 36.3, 115; 204—159.22